(12) United States Patent
Gunawardana et al.

(10) Patent No.: US 6,993,446 B2
(45) Date of Patent: Jan. 31, 2006

(54) METHOD AND APPARATUS FOR PREDICTING THE TIME TO FAILURE OF ELECTRONIC DEVICES AT HIGH TEMPERATURES

(75) Inventors: Ruvinda Gunawardana, Sugar Land, TX (US); Richard K. Etchells, Houston, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 180 days.

(21) Appl. No.: 10/249,117

(22) Filed: Mar. 17, 2003

(65) Prior Publication Data

US 2004/0182573 A1 Sep. 23, 2004

(51) Int. Cl.
*G01R 31/00* (2006.01)

(52) U.S. Cl. .................. 702/117; 702/34; 702/335; 324/537

(58) Field of Classification Search ............ 702/33–35, 702/66–67, 71, 79, 113, 117–118, 130, 136, 702/176, 179, 181; 438/14–15, 17–18; 324/537, 324/763–765, 102–103, 107, 137, 142, 152
See application file for complete search history.

(56) References Cited

U.S. PATENT DOCUMENTS

| | | | | |
|---|---|---|---|---|
| 5,291,419 | A * | 3/1994 | Satoh et al. ................... | 702/34 |
| 5,490,475 | A * | 2/1996 | Bryant et al. ................. | 116/217 |
| 5,793,126 | A * | 8/1998 | Gray ........................... | 307/125 |
| 5,822,218 | A * | 10/1998 | Moosa et al. ................... | 716/4 |
| 5,966,527 | A | 10/1999 | Krivokapic et al. .......... | 703/14 |
| 6,158,381 | A * | 12/2000 | Bray ........................... | 116/216 |
| 6,164,816 | A * | 12/2000 | Aderhold et al. ............... | 374/1 |
| 6,245,583 | B1 * | 6/2001 | Amador et al. ................ | 438/14 |
| 6,304,836 | B1 | 10/2001 | Krivokapic et al. .......... | 703/14 |
| 6,330,526 | B1 | 12/2001 | Yasuda .......................... | 703/2 |
| 6,532,570 | B1 | 3/2003 | Mau .............................. | 716/2 |
| 6,564,166 | B1 * | 5/2003 | Ume et al. .................... | 702/136 |
| 6,720,195 | B2 * | 4/2004 | Jensen .......................... | 438/15 |
| 6,769,805 | B2 * | 8/2004 | Williams et al. ............. | 374/137 |
| 6,787,799 | B2 * | 9/2004 | Asam et al. ................... | 257/48 |
| 2002/0082796 | A1 | 6/2002 | Fang et al. .................. | 702/120 |
| 2002/0105355 | A1 * | 8/2002 | Floyd et al. ................. | 324/765 |
| 2003/0107467 | A1 * | 6/2003 | Bonne et al. ................. | 338/25 |
| 2003/0152132 | A1 * | 8/2003 | Pipe et al. ................... | 374/137 |
| 2004/0036495 | A1 * | 2/2004 | Fazekas et al. ............. | 324/765 |

OTHER PUBLICATIONS

Lewis et al., "Model for Determining Thermal Profiles of Bond Wires Using 'PSPICE' Analysis", Feb. 1991, Semiconductor Thermal Measurement and Management Symposium, pp. 86-90.*

* cited by examiner

*Primary Examiner*—Marc S. Hoff
*Assistant Examiner*—Mary Catherine Baran
(74) *Attorney, Agent, or Firm*—Victor H. Segura; Dale V. Gaudier

(57) ABSTRACT

A method and apparatus are disclosed for determining a time to failure for an electronic device. The method and apparatus includes estimating a dependency of a bond strength degradation rate on at least one parameter and estimating a temperature profile of the electronic device. Furthermore, the method and apparatus determine a bond strength based on the dependency of the bond strength degradation rate and the temperature profile, and determine the time to failure for the electronic device based on a time evolution of the bond strength.

27 Claims, 8 Drawing Sheets

METHOD AND APPARATUS FOR PREDICTING THE TIME TO FAILURE OF ELECTRONIC DEVICES AT HIGH TEMPERATURES

BACKGROUND OF INVENTION

FIG. 1 shows one example of a conventional drilling system for drilling a well bore in an earth formation. The drilling system includes a drilling rig (10) used to turn a drill string (12), which extends downward into a well bore (14). Connected to the end of the drill string (12) is a drill bit (20).

In drilling applications, electronic devices may be used downhole to acquire information about the drilling operation and/or the earth formation. The electronic devices may need to be operated at temperatures much higher than their rated operational range. As the wells are drilled deeper, the desired operating temperature range for the electronic devices increases.

The electronic devices market is driven primarily by the computer and communications industries. Neither the computer nor communications industries typically have a need to operate electronic devices above 85° C. While there are a few industries, for example, the automobile, aerospace, and oil industries, that have a need to operate electronic devices at such higher temperatures, none of these industries purchase electronic devices in volumes that influence the electronics manufacturers to design electronic devices that operate at such higher temperatures. Accordingly, these industries may operate the electronic devices outside the electronics manufacturer's recommended operating temperature range.

As shown in FIG. 2, an exemplary plastic encapsulated integrated circuit (100) includes an integrated circuit or die (110) encased in a molding compound (102). The die (110) communicates through bond wires (108) between the die (110) and a lead frame (106). The lead frame (106) extends beyond the molding compound (102) so that leads (104) may be attached to a substrate, e.g., printed circuit board, or wire (not shown).

When electronic devices, for example the plastic encapsulated integrated circuit (100) shown in FIG. 2), are operated at high temperature, chemical reactions may cause internal failures to be accelerated and cause premature failure. Furthermore, thermal expansion of dissimilar materials may result in high stresses to develop and cause failure. Typically, the failures are at the wire bonds of the plastic encapsulated integrated circuit (100) shown in FIG. 2). Both the weakening of the wire bond strength due to corrosion reactions combined with high stresses due to coefficient of thermal expansion (CTE) mismatches in the materials within the plastic encapsulated integrated circuit (100) lead to premature failure. Research in the field of high temperature electronics has shown that chemical reactions that cause the weakening of wire bonds are accelerated by the presence of halogens (Br, Cl, Fl, etc.) and Antimony introduced into the molding compound of the electronic devices as flame-retardants.

Mechanisms that cause a plastic encapsulated integrated circuit (100) shown in FIG. 2) to fail at high temperatures have received some attention. Several researchers have found that halogens such as Br, Cl, and Fl introduced into the molding compound as flame-retardants accelerate intermetallic formation and cause voiding and corrosion leading to wire bond failure. Antimony was also found to accelerate wire bond failures and may affect the wire bonds independently of Br. A chain of reactions that cause these chemicals to weaken the wire bonds was also proposed and partially verified with experiments. A potential solution to the problem of accelerated wire bond failure under high temperatures is the introduction of Pd to gold bond wires to slowdown corrosion. Furthermore, reducing an amount of Br present in a molding compound of a plastic encapsulated integrated circuit (100 shown in FIG. 2) increased longevity of the plastic encapsulated integrated circuit (100 shown in FIG. 2) at high temperatures. A change in construction of a plastic encapsulated integrated circuit (e.g., 100 shown in FIG. 2) is, however, not a practical solution since a manufacturing process of an electronic device is unlikely to be influenced for the reasons discussed above.

Electronic devices, e.g., plastic encapsulated integrated circuits (100 shown in FIG. 2), may be operated safely at temperatures much higher than the rated temperature for a shorter period of time than their intended lifetime. When electronic devices are operated at higher temperatures, however, a failure of the electronic devices may be accelerated. Accordingly, a method and apparatus that are capable of predicting potential failures of electronic devices used in harsh environments are desirable.

SUMMARY OF INVENTION

According to one aspect of the present invention, a method for determining a time to failure for an electronic device comprising estimating a dependency of a bond strength degradation rate of a wire bond on at least one parameter; estimating a temperature profile of the electronic device; determining a bond strength based on the dependency of the bond strength degradation rate and the temperature profile; and determining the time to failure for the wire bond based on a time evolution of the bond strength.

According to one aspect of the present invention, a computer system for determining a time to failure for an electronic device comprising a processor; a memory; and software instructions stored in the memory adapted to cause the computer system to perform determining a bond strength based on an estimated dependency of a bond strength degradation rate on at least one parameter and an estimated temperature profile of the electronic device; and determining the time to failure for the electronic device based on a time evolution of the bond strength.

According to one aspect of the present invention, an apparatus for determining a time to failure for an electronic device comprising means for estimating a dependency of a bond strength degradation rate on at least one parameter; means for estimating a temperature profile of the electronic device; means for determining a bond strength based on the dependency of the bond strength degradation rate and the temperature profile; and means for determining the time to failure for the electronic device based on a time evolution of the bond strength.

Other aspects and advantages of the invention will be apparent from the following description and the appended claims.

DETAILED DESCRIPTION

Embodiments of the present invention include methods for predicting time to failure (TTF) of an electronic device, such as a plastic encapsulated integrated circuit, when used at temperatures beyond the electronics manufacturer's recommended operating temperature range. A method in accordance with the invention includes a model of failure mechanisms, which relate a series of measurable parameters representing independent variables to predict a time to failure of electronic devices. The model lends itself to algorithmic representation that can be implemented in software operated on a computer system.

Figure 3:
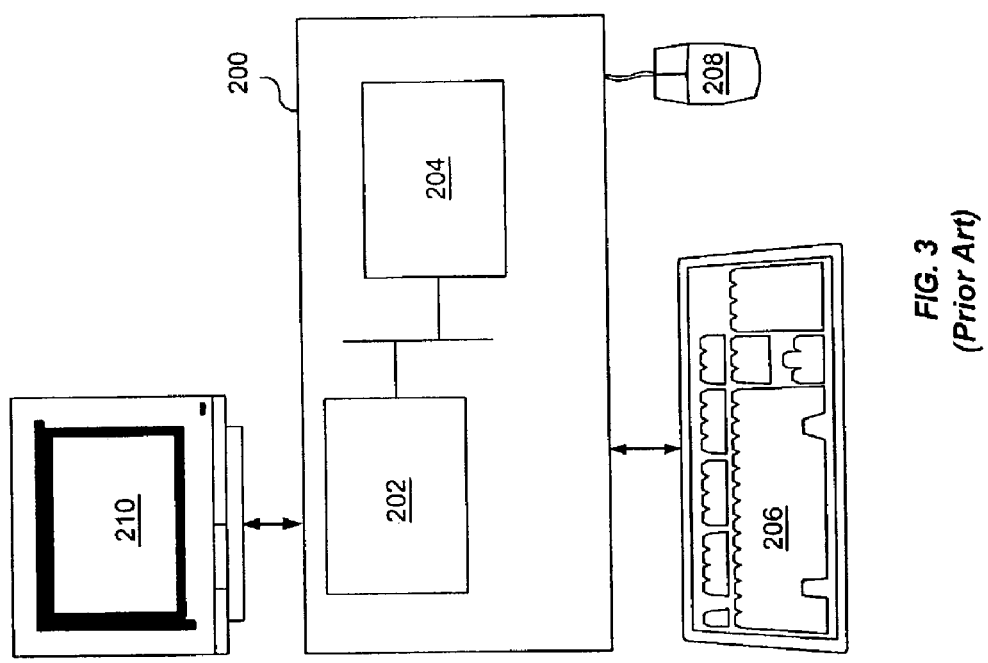
FIG. 3 is a block diagram of a typical computer system.

The invention described here may be implemented on virtually any type of computer regardless of the platform being used. For example, as shown in FIG. 3, a typical computer (200) has a processor (202), associated memory (204), and numerous other elements and functionalities typical to today's computers (not shown). The computer (200) has associated therewith input means such as a keyboard (206) and a mouse (208), although in a given accessible environment these input means may take other forms. The computer (200) is also associated with an output device such as a display (210), which also may take a different form in a given accessible environment.

In one or more embodiments, an electronic device, such as a plastic encapsulated integrated circuit, is tested at a particular temperature. Measurements of the electronic device occur such that degradation and/or failure of the electronic device in time may be determined at the particular temperature. Accordingly, a database of different electronic devices and/or device parameters, and the electronic device's degradation and/or failure characteristics at different temperatures may be recorded. A prediction of time to failure for an electronic device may be determined if a temperature profile (i.e., temperature over time) is known. A time to failure for the electronic device may be determined by using interpolation or extrapolation of the electronic device's features, and interpolation or extrapolation of data in the database.

Figure 1:
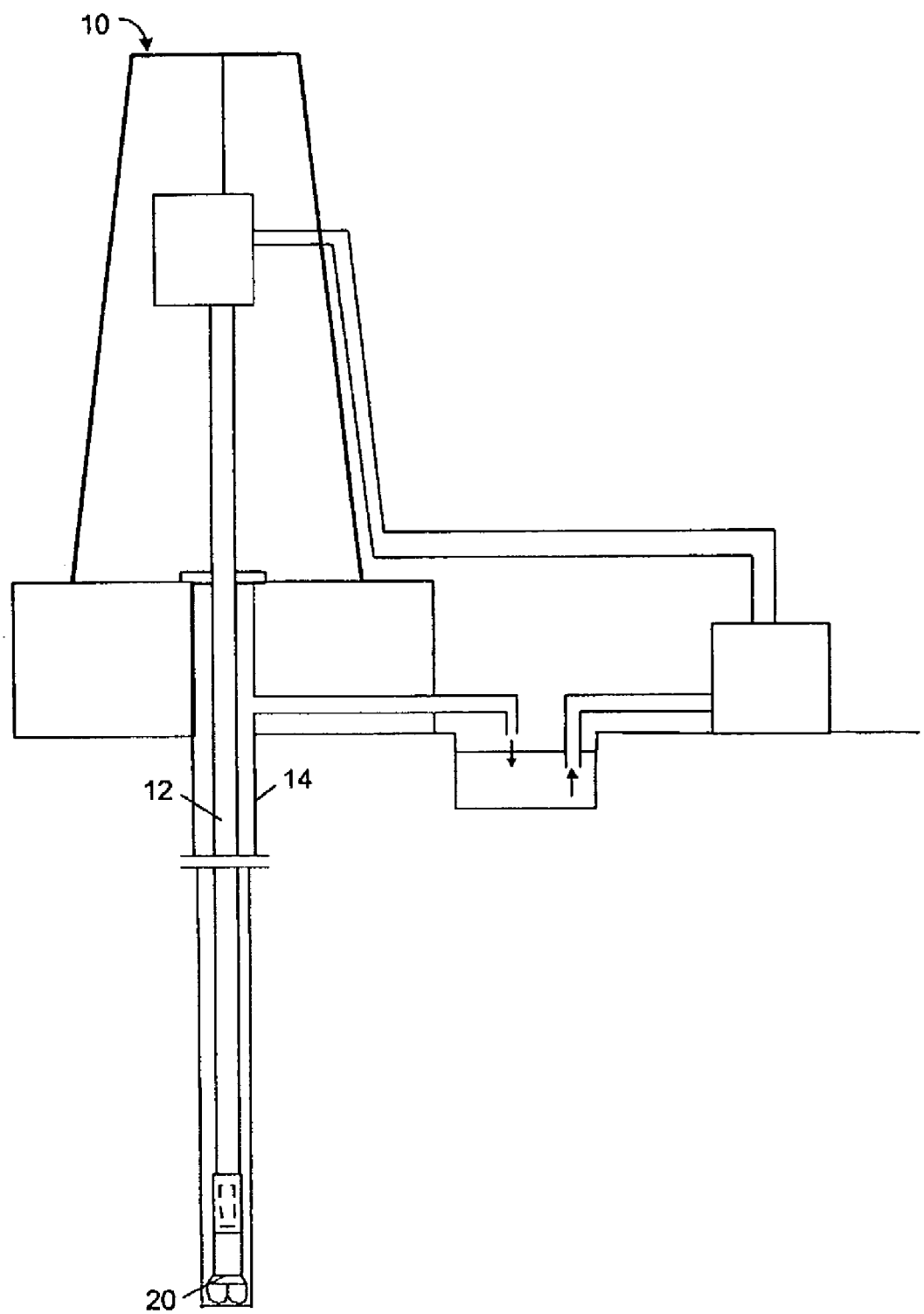
FIG. 1 is a diagram of a typical drilling system.
Figure 2:
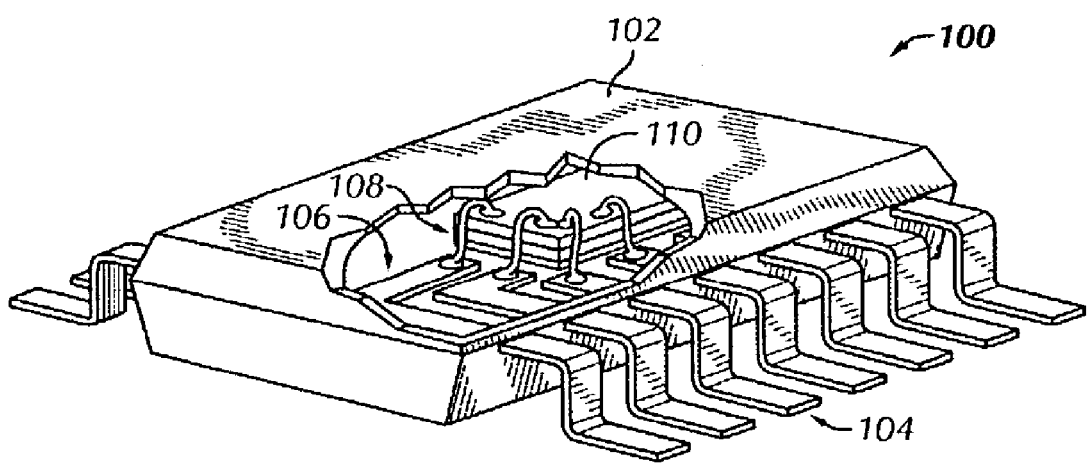
FIG. 2 is a diagram of a typical plastic encapsulated integrated circuit.

While embodiments of the present invention are applicable to any electronic device, the following description uses a plastic encapsulated integrated circuit as an example to illustrate embodiments of the present invention. In FIG. 2, a typical plastic encapsulated integrated circuit (100) is shown. The die (110), which contains the internal circuitry, is typically centered in the plastic encapsulated integrated circuit (100). The leads (104) are electrically connected to the die (110) via bond wires (108). In a typical plastic encapsulated integrated circuit, the bond wires (108) are gold while the bond pads (not shown) on the die (110) to which the bond wires (108) are attached are made of a thin layer of aluminum. A gold/aluminum interface is formed at the location where the bond wire (108) is attached to the die (110). The die (110), bond wires (108), and lead frame (106) are all encapsulated by a molding compound (102).

Figure 4:
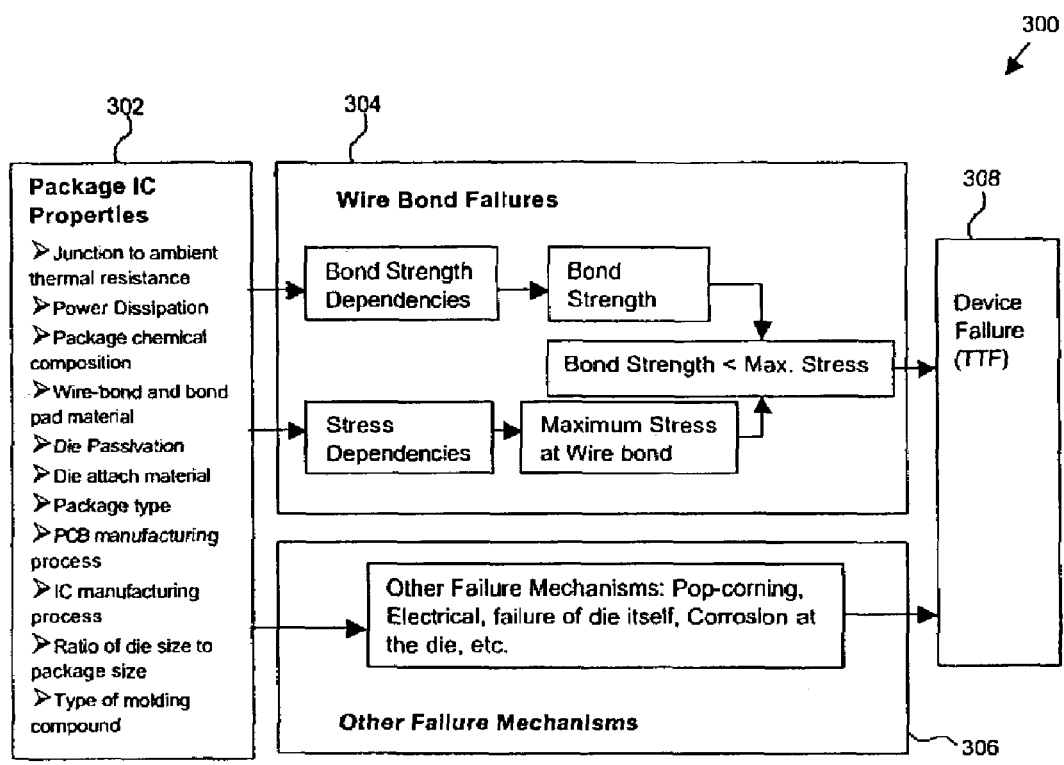
FIG. 4 is a block diagram of package integrated circuit properties and failure mechanisms in accordance with an embodiment of the present invention.

FIG. 4 shows an exemplary block diagram (300) of package integrated circuit (IC) properties and failure mechanisms in accordance with an embodiment of the present invention. Many different mechanisms may cause a plastic encapsulated integrated circuit to fail. For example, properties of a plastic encapsulated integrated circuit that determine the progression of various failure mechanisms are shown in block (302).

As shown in block (302) of FIG. 4, package integrated circuit (IC) properties that may affect a failure mechanisms may include junction to ambient thermal resistance, power dissipation, molding compound chemical composition, bond wire and bond pad material, die passivation, die attach material, molding compound geometry, printed circuit board manufacturing process, integrated circuit manufacturing process, ratio of die size to plastic encapsulated integrated circuit size, and/or type of molding compound. Furthermore, thermal expansion of dissimilar materials may result in high stresses and cause failure. The wire bond (i.e., the bond between a bond wire and die, or bond wire and lead frame) strength may weaken due to corrosion reactions combined with high stresses due to CTE (Coefficient of Thermal Expansion) mismatches in the materials within the package. The weakening of the wire bond may lead to premature failure of the electronic device, such as a plastic encapsulated integrated circuit.

Block (308) represents a failure of the plastic encapsulated integrated circuit, or in other words, a time to failure (TTF). Many mechanisms can cause the failure of a plastic encapsulated integrated circuit. However, wire bond failures seem to account for a majority of the failures. Therefore, the failure mechanisms may be broadly categorized into two categories. The first category, wire bond failures (304), represents a typical failure mechanism. The second category, other failure mechanisms (306), may include, for example, die failure, electrical failures of the die, etc.

The following description focuses on wire bond failures as a failure mechanism. Using wire bond failures as the focus is for illustration purposes only. Other failure mechanisms can be similarly addressed by the present invention.

In modeling wire bond failures, the bond strength and the maximum stresses at the wire bond are considered. Failure occurs when the stress level exceeds the bond strength. The failure may be caused by both a decrease in bond strength due to, for example, chemical reactions as well as high stresses at the wire bond from CTE (Coefficient of Thermal Expansion) mismatches due to various materials present at the wire bond. The present invention enables predicting a rate of bond strength degradation for an electronic device.

A dominant failure mechanism of the bond wires (108 shown in FIG. 2) occurs at the gold/aluminum interface of the wire bond. The failure may occur due to a or a combination of effects. For example, the failure may be caused by a series of chemical reactions that accelerate a gold-aluminum inter-metallic formation. The gold-aluminum inter-metallic formation may cause voiding. The chemical reactions, for example, may arise from the presence of halogens such as Br, Cl, Fl, etc., and antimony (Sb) introduced into the molding compound of these devices as flame-retardants. The reactions may weaken bond strength and corrode the gold and aluminum, leading to premature failure.

In order to predict a time to failure of an electronic device, a model is obtained from experimental and theoretical data.

Once the model variables are selected and obtained, a prediction of a bond strength degradation rate as a function of operating temperature may be computed. The bond strength includes wire bond strength between a bond wire and die and/or bond wire and lead frame.

The prediction may be computed as a time evolution of bond strength during a lifetime of an electronic device based on an estimated operating temperature profile for the electronic device. The model may also enable a prediction of the maximum stresses experienced by the electronic device in an operating environment (e.g., an amount of time an electronic device is maintained at one or more temperatures). The model may allow a prediction of the level of bond strength at which the electronic device will fail. The model allows a prediction of the time at which the bond strength will cross a minimum required bond strength threshold for the electronic device to operate. Crossing the threshold (or a desired value) indicates the time spent at one or more temperatures at which the electronic device is predicted to fail. Accordingly, a time to failure of an electronic device may be predicted.

The model represents mechanisms that cause a wire bond in an electronic device to fail. For example, parameters used to estimate a bond strength degradation rate may include a CTE, a glass transition temperature, a geometry of a die and a bond wire layout, a die size, a plastic encapsulated integrated circuit size, and shock and vibration. Each of the variations of the parameters may be correlated to temperature.

The model may be used to consider the bond strength as well as the maximum stresses at the bond wire. For example, to predict a bond strength degradation rate for a plastic encapsulated integrated circuit, parameters may be modeled. Each parameter may be modeled by a numeric value and a set of parameters may be grouped in a vector $\vec{x}$, $$\vec{x} = (x_1, x_2, \ldots, x_n)^T \tag{1}$$

where the parameters $x_1, \ldots, x_n$ represent various properties of the plastic encapsulated integrated circuit or electronic device. For example, one of the parameters could be a temperature rise in degrees centigrade from a bond wire to an ambient temperature that would represent a junction to ambient thermal resistance and a power dissipation combined. Another parameter, for example, could be the concentration of Sb (which is known to strongly influence the bond strength degradation) as a weight percentage that would be one of the variables representing a chemical composition. Thus, the vector $\vec{x}$ may represent the independent variables in the model and the vector $\vec{x}$ can be computed for any plastic encapsulated integrated circuit or electonic device with some basic information about the application (such as power consumption), information from the data sheet, and some chemical analysis.

Figure 5B:
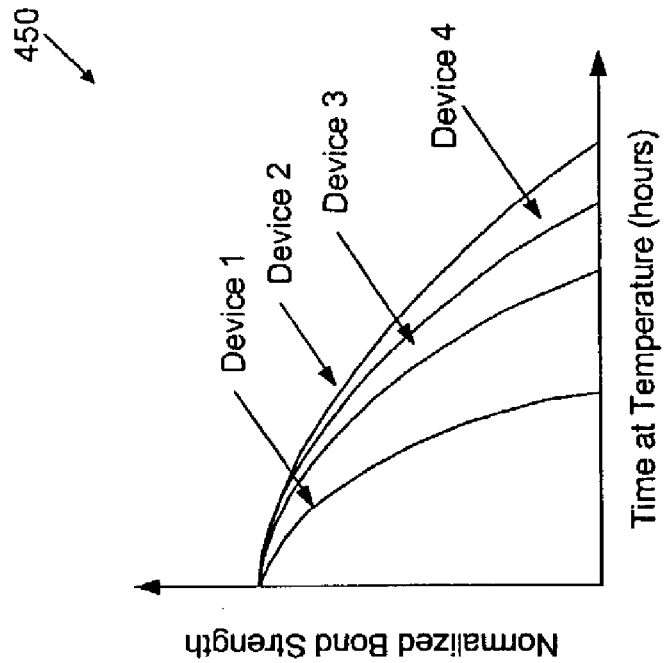
FIG. 5B is a graph of normalized bond strength degradation versus time in accordance with an embodiment of the present invention.
Figure 5A:
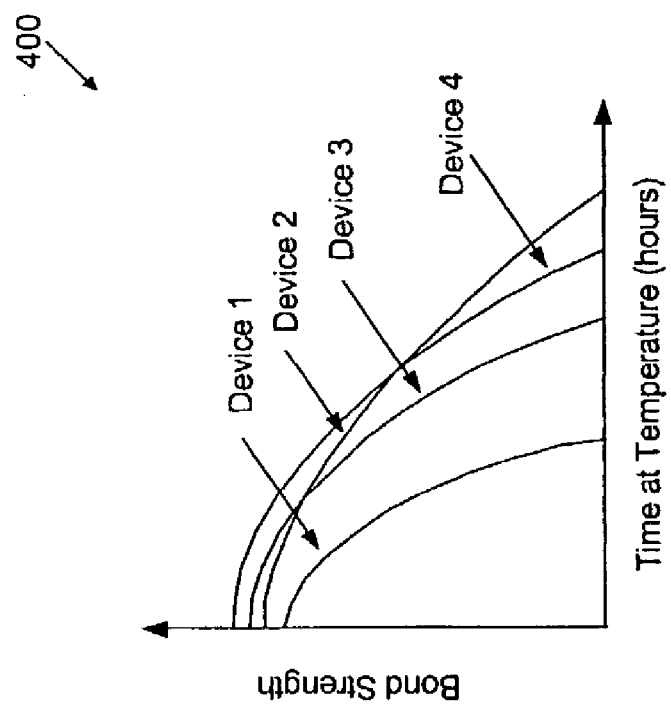
FIG. 5A is a graph of bond strength degradation versus time in accordance with an embodiment of the present invention.

FIGS. 5A and 5B show exemplary graphs of bond strength (400) and normalized bond strength (450) degradations as a function of time at a particular temperature in accordance with an embodiment of the present invention. A graph (400) of the bond strength as a function of time at a particular temperature for various electronic devices (Device 1, Device 2, Device 3, Device 4) shows curves with gradual degradation of bond strength. By dividing each of the bond strength curves with its initial bond strength, a graph (450) of a normalized bond strength as a function of time at a particular temperature for the various electronic devices is obtained, which shows curves with gradual degradation of bond strength that begin with 1 and decreases to 0. If bond strength degradation can be characterized by an exponential decay as shown in FIG. 5B, each curve is characterized by a rate constant y. The bond strength degradation may be any shape, and may be represented by an appropriate equation. The bond strength as a function of time can be defined as:

$$\text{bond\_strength}(t) = e^{-yt}, \tag{2}$$

where t is time. Thus, the bond strength may be numerically represented for a plastic encapsulated integrated circuit. The bond strength degradation rate y is a function of various properties of the electronic device. A method in accordance with the present invention characterizes the relationship between the bond strength degradation rate y and various properties of the electronic device $\vec{x}$ in the following form:

$$y = f(\vec{x}) \tag{3}$$

Bond strength degradation rate may be represented by several parameters. Accordingly, the bond strength degradation rate y may be a vector. Equation 3 may be rewritten in a linear form as follows:

$$y = \vec{x} \cdot \vec{a} \tag{4}$$

where the vector $\vec{a}$ represents a strength of influence of each of the parameters in $\vec{x}$ on the bond strength degradation rate. In other words, vector $\vec{a}$ measures a dependency of a bond strength degradation rate on the properties (parameters) of the electronic device. The values in the vector $\vec{a}$ having a stronger influence on the bond strength degradation rate will be larger while the values in the vector $\vec{a}$ having a weaker influence on the bond strength degradation rate will be smaller. The values in the vector $\vec{a}$ will be constant for all plastic encapsulated integrated circuits of the same type at a particular temperature.

The bond strength degradation rate may be predicted by computing the values in the vector $\vec{a}$ using, for example, linear optimization. One of ordinary skill in the art having benefit of the present invention would understand that other relationships may also be used, for example, a polynomial function optimization, or an exponential or log function optimization. Experimental data may be used in the linear optimization. A series of experiments may be conducted to measure bond strength degradation rates for a series of electronic devices. The measured value of y may be denoted by y' for each electronic device in the series of electronic devices. Vector $\vec{x}$ and y' may be measured. If the number of electronic devices are denoted by m, measured value pairs $$(\vec{x}_1, y'_1), (\vec{x}_2, y'_2), \ldots, (\vec{x}_m, y'_m)$$

corresponding to the m electronic devices, may be obtained. For each of the electronic devices, Equation 4 may be applied to obtain the following equation:

$$y_i = \vec{x}_i \vec{a}, \quad (5)$$

for i=1, . . . m.

By grouping the equations from Equation 5 in adjacent rows, the following equation is obtained:

$$\begin{pmatrix} y_1 \\ \vdots \\ y_m \end{pmatrix} = \begin{pmatrix} \vec{x}_1 \\ \vdots \\ \vec{x}_m \end{pmatrix} \vec{a} \quad (6)$$

which can be written in matrix form as, $$\vec{y} = X\vec{a}, \quad (7)$$

where $\vec{y} = (y_1, \ldots, y_m)^T$, and X is a matrix constructed by arranging the vectors $\vec{x}_1 \ldots \vec{x}_m$ along each row. The superscript T is used to denote a vector/matrix transpose operator. The measured value of $\vec{y}$ is based on the experiments and may be denoted by $\vec{y}' = (y'_1, \ldots, y'_m)^T$. The vector $\vec{a}$ may be computed by minimizing the least square error, $(\vec{y}' - \vec{y})^T (\vec{y}' - \vec{y})$, by setting:

$$\frac{d[(\vec{y}' - \vec{y})^T (\vec{y}' - \vec{y})]}{d\vec{a}} = 0. \quad (8)$$

Vector $\vec{a}$ may be solved by substituting Equation 7 into Equation 8. By substituting Equation 7 into Equation 8, the following expressions may be obtained:

$$\frac{d[(\vec{y}' - X\vec{a})^T (\vec{y}' - X\vec{a})]}{d\vec{a}} = \frac{d[\vec{y}'^T \vec{y}' + \vec{a}^T X^T X \vec{a} - 2\vec{a}^T X^T \vec{y}']}{d\vec{a}} = 0, \quad (9)$$

$$2X^T X \vec{a} - 2X^T \vec{y}' = 0, \quad (10)$$

$$X^T X \vec{a} = X^T \vec{y}'. \quad (11)$$

Equation 13 follows immediately from Equation 11, $$\vec{a} = (X^T X)^{-1} X^T \vec{y}'. \quad (13)$$

The values in vector $\vec{a}$ from Equation 13 provide a bes fit of the experimental data to Equation 7. There is no limit on the amount of experimental data that can be used in the computation of vector $\vec{a}$ in Equation 13. Furthermore, as more data are obtained, vector $\vec{a}$ may be updated to improve the model. Because vector $\vec{a}$ is constant for all plastic encapsulated integrated circuits used in the experiment, a sufficient amount of experimental data provides a high confidence solution for any plastic encapsulated integrated circuit. Accordingly, a method for predicting the bond strength degradation rate for any plastic encapsulated integrated circuit is provided.

From FIG. 4, in order to predict the TTF, the model may also need to predict the maximum stresses seen at the wire bond and then estimate the minimum required bond strength for the wire bond to not fail. The stresses at the wire-bond may be dependent on several factors. Some of these factors are listed as examples: (1) (Coefficient of Thermal Expansion) mismatches between the various materials at the wire bond (the die, molding compound, wire bond, etc.); (2) The glass transition temperature of the molding compound; (3) Geometry of the die and wire bond layout; (4) Die size; (5) Package size; (6) Shock and vibration (which can become important when the package integrity is lost due to delamination).

The maximum stress may be estimated based on the above dependencies. In addition, these estimates can be verified and improved upon by using experimental data. By this process, a prediction of a maximum stress experienced by an electronic device in an operating environment is possible.

By comparing a predicted maximum stress experienced by an electronic device to an estimated minimum required bond strength for a wire bond to not fail, a time to failure (TTF) may be predicted. The estimated TTF would be the point in time at which the estimated bond strength decreases below a minimum required bond strength (or a desired value). Accordingly, a time evolution of a wire bond strength for an electronic device may be generated using the above predicted bond strength degradation.

Figure 6:
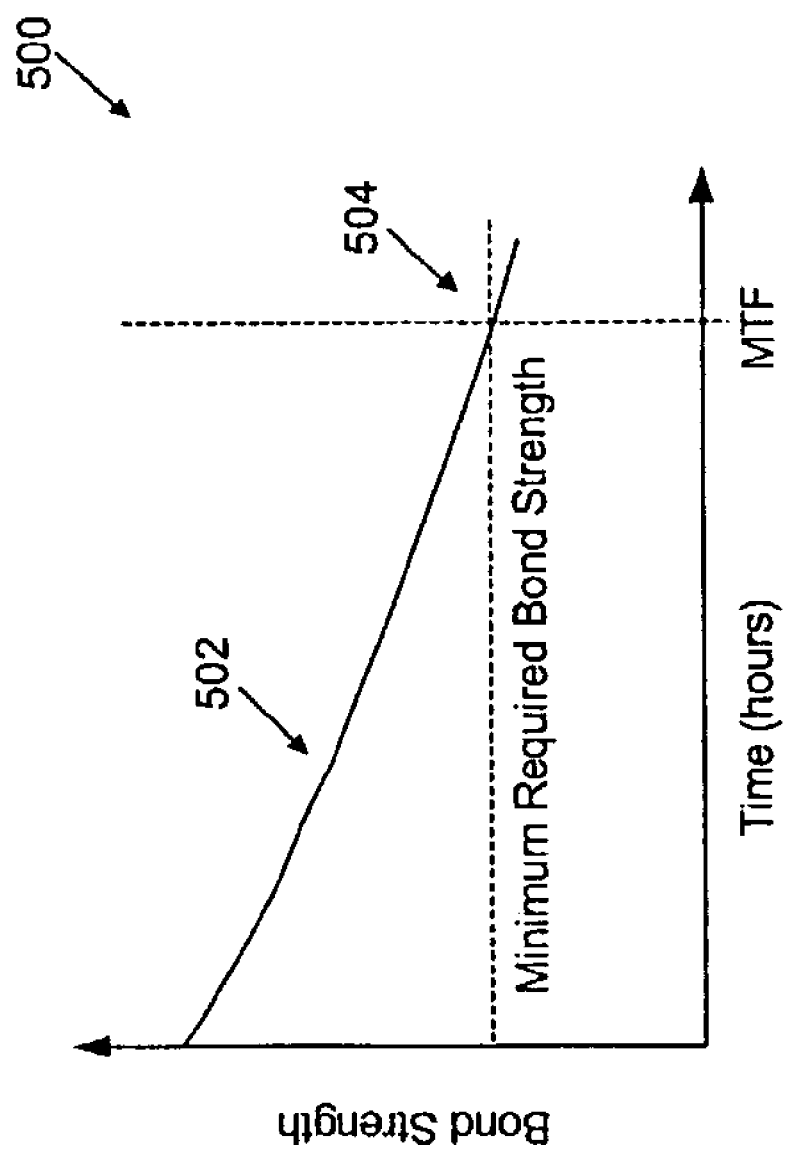
FIG. 6 is a graph of bond strength versus time at a particular temperature in accordance with an embodiment of the present invention.

FIG. 6 shows an exemplary graph (500) of bond strength versus time at a particular temperature in accordance with an embodiment of the present invention. A curve (502) of bond strength shows that bond strength decreases with time. At a point in time (504), the curve (502) of bond strength decreases below a minimum required bond strength (or a desired value). The point in time (504) at which the the curve (502) of bond strength decreases below a minimum required bond strength (or a desired value) provides an estimate of TTF. The minimum required bond strength may be a fixed value. Furthermore, as noted above, the minimum required bond strength may be estimated from data gathered from a plurality of electronic devices, and/or estimated based on a temperature profile of a device for which TTF is being predicted.

Because the parameters used in the above methods are temperature dependent, the bond strength degradation rate obtained is valid only for the specific temperature. In order to predict the TTF of an electronic device, the bond strength degradation rate y should be estimated over a temperature range. That is, y(T), where T represents temperature, should be estimated for a plastic encapsulated integrated circuit. In accordance with one embodiment of the present invention, the procedures for predicting a bond strength degradation rate are repeated at several discrete temperatures and the vector $\vec{a}$ at each of the various temperatures is determined. Thus, $\vec{a}(T_1), \vec{a}(T_2), \ldots, \vec{a}(T_1)$ are obtained for several discrete temperatures, $T_1, T_2, \ldots, T_1$. The values $\vec{a}(T_1), \vec{a}(T_2), \ldots, \vec{a}(T_1)$ may then be used to estimate the corresponding bond strength degradation rates $y(T_1), y(T_2), \ldots, y(T_1)$ for an electronic device. Once the bond strength degradation rates at these temperatures are determined, the bond strength degradation rate at any temperature y(T) may be obtained by interpolation. Furthermore, a temperature profile for an electronic device may be estimated over the electronic device's operational lifetime. Based on the temperature profile and the bond strength degradation rate y(T) at any temperature, the time evolution of the bond strength for the device over the lifetime of the device becomes possible to estimate.

Figure 7:
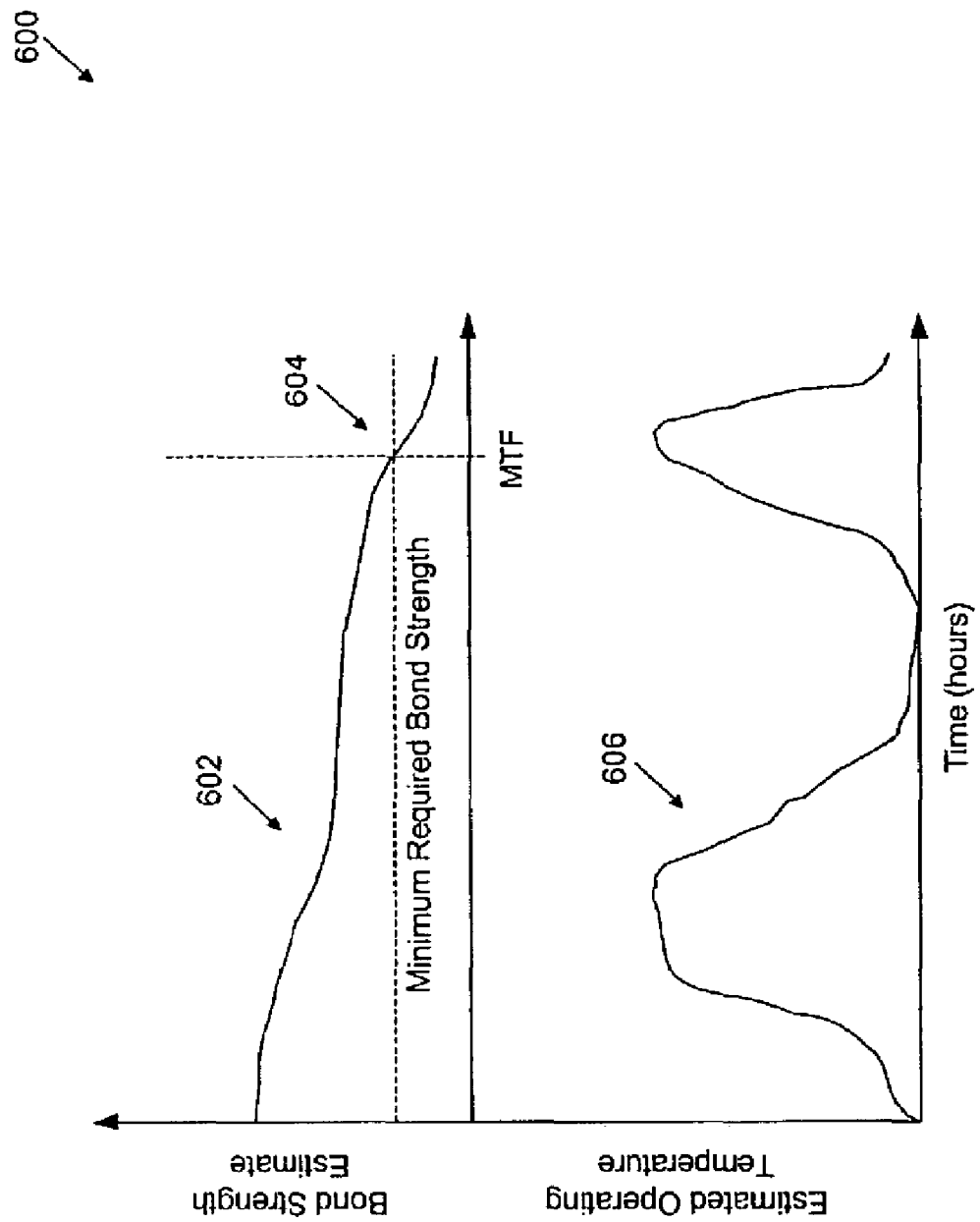
FIG. 7 is a graph of a bond strength estimate versus time in accordance with an embodiment of the present invention.

FIG. 7 shows an exemplary graph (600) of a bond strength estimate versus time in accordance with an embodiment of the present invention. An exemplary graph (602) of a time evolution of a bond strength for an electronic device over a lifetime of an electronic device is shown. By using the bond strength degradation rate predicted by y(T) at each point in time based on an estimated temperature (606) at the point in time, the bond strength (602) for the electronic device may be predicted. Accordingly, a curve, or equally a slope, may be calculated to advance the bond strength degradation rate to a future point in time.

An estimate for TTF (604) is given by a point at which the bond strength falls below a minimum required bond strength or deisred value. Accordingly, a method for predicting the TTF of an electronic device, such as a plastic encapsulated integrated circuit, during operation of the device circuit is provided.

Figure 8:
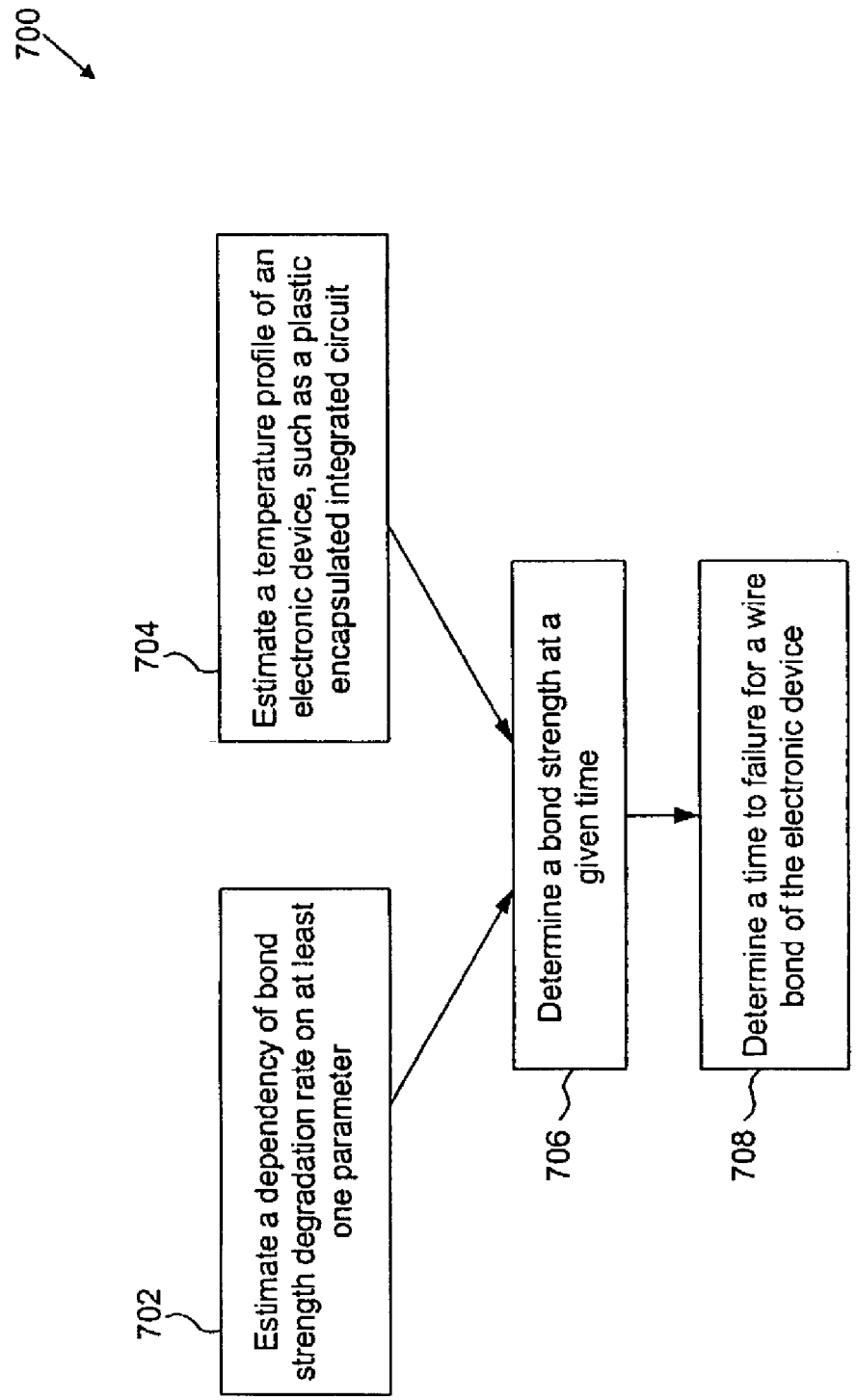
FIG. 8 is a flow diagram for determining a time to failure for a wire bond of a plastic encapsulated integrated circuit in accordance with an embodiment of the present invention.

FIG. 8 shows an exemplary flow diagram (700) for determining a TTF for an electronic device, such as a wire bond of a plastic encapsulated integrated circuit, in accordance with an embodiment of the present invention. At step 702, a dependency of bond strength degradation rate on at least one parameter is estimated. The dependency may be computed in advance of steps 704, 706, and 708. At step 704, a temperature profile of an electronic device, such as a plastic encapsulated integrated circuit, is estimated. The temperature profile may be determined by, for example, measuring a downhole temperature over time. One of ordinary skill in the art will understand that estimating a temperature profile of a plastic encapsulated integrated circuit may be accomplished by a variety of methods using a variety of means.

At step 706, the dependency in step 702 and the temperature estimated in step 704 are used to determine a bond strength at a given time. Step 706 may use a database of values computed and/or stored prior to step 706. Step 706 may compute a bond strength as described above, for example, using the vector $\vec{a}$.

In step 708, a time to failure for a wire bond of the electronic device is determined. A time evolution of the bond strength may be obtained by extending the temperature profile obtained in step 704 and repeating steps 706 and 708. Accordingly, a time to failure for a wire bond of a plastic encapsulated integrated circuit may be determined by comparing a bond strength value to a minimum required bond strength, or desired value.

One of ordinary skill in the art, having benefit of the present invention, would understand that a plurality of electronic devices, such as a plastic encapsulated integrated circuit, may be tested. The electronic devices may be tested at different fixed temperatures. A degradation and/or failure of the electronic devices may be determined at each particular temperature.

Some of the electronic devices may be of the same type. Accordingly, variations in a parameter for similar devices may be obtained. Furthermore, some of the electronic devices may be of a different type. Different electronic devices may provide information about variations in a parameter caused by the different features between the electronic devices.

For example, ten similar electronic devices may have a relatively small die size with a relatively small number of bond pads. Five of the ten similar electronic devices may all be tested at a fixed temperature. The testing may reveal a minimum time for failure and/or degradation rates for one or more parameters at the fixed temperature. The remaining five of the ten similar electronic devices may all be tested at a different fixed temperature. Again, the testing may reveal a minimum time for failure and/or degradation rates for one or more parameters at the different fixed temperature.

Furthermore, ten similar electronic devices may have a relatively large die size with a relatively large number of bond pads. Five of the ten similar electronic devices may all be tested at a fixed temperature. The testing may reveal a minimum time for failure and/or degradation rates for one or more parameters at the fixed temperature. The remaining five of the ten similar electronic devices may all be tested at a different fixed temperature. Again, the testing may reveal a minimum time for failure and/or degradation rates for one or more parameters at the different fixed temperature. All of the results from the testing of the relatively small and relatively large electronic devices may be stored in a database. The database may also contain optimization (e.g., linear, polynomial function, exponential or log function, etc.) results.

Time to failure prediction for a different electronic device from the relatively small and relatively large electronic devices previously tested may be desired. Accordingly, the information from the database may be interpolated or extrapolated. Also, if any of the electronic devices require a time evolution step at a temperature not previously tested, interpolated or extrapolated temperature results may be obtained from the database. Furthermore, interpolation between a bond strength degradation rate of a first parameter and a bond strength degradation rate of a second parameter may be used to determine a bond strength, which may be used to determine a time to failure for an electronic device.

One of ordinary skill in the art will understand that a time period at a particular temperature may vary. Also, a time to failure predicted by the present invention may be a concatenation of one or more time periods of use. An electronic device may be used, for example, over a time period at temperatures above a manufacturer's maximum rating. The time period at temperature may not be sufficient to expert failure; however, an accumulation of different time periods at temperatures above a manufacture's maximum rating may be sufficient to expert failure.

One of ordinary skill in the art will understand that while the present invention may have application in automotive, aerospace, defense, and other industries, the present invention is important for downhole oil well electronics. Areas of application for the present invention include, but are not limited to, wire line logging tools, measurement while drilling tools, logging while drilling tools, perforating tools, permanent monitoring equipment, and downhole meters. The present invention may enable time to failure of an electronic device substantially anywhere electronic devices are used in a downhole oil or energy industry application.

Advantages of the present invention may include one or more of the following. In one or more embodiments, a method for predicting a time to failure of a plastic encapsulated integrated circuit is provided. The method lends itself to algorithmic representation that can be implemented in software. Thus, an apparatus for predicting time to failure of an electronic device in accordance with the present invention may comprise a computer system having a processor and a memory for storing software to perform these methods. Accordingly, the plastic encapsulated integrated circuit may be replaced before failure. Furthermore, a prediction of the time to failure may be known, which allows decisions to be made based on the prediction.

In one or more embodiments, a time to failure may be determined. An accuracy of the determination of the time to failure may be obtained. Accordingly, information obtained from previous time to failure determinations may be used to improve the determination of the time to failure.

In one or more embodiments, because a database is developed that contains information about a plurality of electronic devices and the electronic devices' characteristics with respect to temperature over a time duration, time to failure for an electronic device may be predicted dependent on the database. Also, information from the database may be interpolated or extrapolated to predict the time to failure. Furthermore, additional information may be added to the database that may improve a predicted time to failure.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for determining a time to failure for an electronic device, comprising:
    estimating a dependency of a bond strength degradation rate of a wire bond in the electronic device on at least one parameter;
    estimating a temperature profile of the electronic device;
    determining a bond strength based on the dependency of the bond strength degradation rate and the temperature profile; and
    determining the time to failure for the wire bond based on a time evolution of the bond strength.

2. The method of claim 1, further comprising:
    developing a database of the at least one parameter representative of a plurality of electronic devices, wherein the determining the time to failure is dependent on the database.

3. The method of claim 1, wherein the electronic device is a plastic encapsulated integrated circuit.

4. The method of claim 1, wherein the at least one parameter is selected from the group consisting of a junction to ambient thermal resistance, power dissipation, package chemical composition, wire bond and bond pad material, die passivation, die attach material, package type, printed circuit board manufacturing process, integrated circuit manufacturing process, ratio of die size to package size, and type of molding compound.

5. The method of claim 1, wherein the estimating the dependency comprises using experimentally obtained data.

6. The method of claim 1, wherein the bond strength degradation rate depends on a temperature.

7. The method of claim 1, wherein the estimating the temperature profile comprises measuring a downhole temperature in a well bore.

8. The method of claim 1, wherein the determining the bond strength comprises using at least one of a linear optimization, a polynomial function optimization, and an exponential function optimization.

9. The method of claim 1, wherein the determining the time to failure comprises comparing the bond strength to a minimum required value.

10. The method of claim 9, wherein the minimum required value comprises a maximum stress at the wire bond.

11. The method of claim 9, wherein the minimum required value is dependent on at least one selected from the group consisting of a coefficient of thermal expansion, a glass transition temperature, a geometry of a die and a bond wire layout, a die size, a package size, and shock and vibration.

12. The method of claim 1, wherein the determining the time to failure is dependent on information obtained from previous time to failure determinations.

13. The method of claim 1, wherein the at least one parameter comprises a first parameter and a second parameter, and wherein the determining the bond strength is dependent on an interpolation between the bond strength degradation rate of the first parameter and the bond strength degradation rate of the second parameter.

14. A computer system for determining a time to failure for an electronic device, comprising:
    a processor;
    a memory; and
    software instructions stored in the memory adapted to cause the computer system to perform:
    determining a bond strength based on an estimated dependency of a bond strength degradation rate on at least one parameter and an estimated temperature profile of the electronic device; and
    determining the time to failure for the electronic device based on a time evolution of the bond strength.

15. The computer system of claim 14, wherein the determining the time to failure for the electronic device is dependent on a database comprising the at least one parameter representative of a plurality of electronic devices.

16. The computer system of claim 14, wherein the electronic device is a plastic encapsulated integrated circuit.

17. The computer system of claim 14, wherein the at least one parameter is selected from the group consisting of a junction to ambient thermal resistance, power dissipation, package chemical composition, bond wire and bond pad material, die passivation, die attach material, package type, printed circuit manufacturing process, integrated circuit manufacturing process, ratio of die size to package size, and type of molding compound.

18. The computer system of claim 14, wherein the estimated dependency is derived using experimentally obtained data.

19. The computer system of claim 14, wherein the bond strength degradation rate depends on a temperature.

20. The computer system of claim 14, wherein the estimated temperature profile is based on measured downhole temperatures.

21. The computer system of claim 14, wherein the determining the bond strength comprises using at least one of a linear optimization, a polynomial function optimization, and an exponential function optimization.

22. The computer system of claim 14, wherein the determining the time to failure comprises comparing the bond strength to a minimum required value.

23. The computer system of claim 22, wherein the minimum required value comprises a maximum stress at a wire bond.

24. The computer system of claim 22, wherein the minimum required value is dependent on at least one selected from the group consisting of a coefficient of thermal expansion, a glass transition temperature, a geometry of a die and a bond wire layout, a die size, a package size, and shock and vibration.

25. The computer system of claim 14, wherein the determining the time to failure is dependent on information obtained from previous time to failure determinations.

26. The computer system of claim 14, wherein the at least one parameter comprises a first parameter and a second parameter, and wherein the determining the bond strength is dependent on an interpolation between the bond strength degradation rate of the first parameter and the bond strength degradation rate of the second parameter.

27. An apparatus for determining a time to failure for an electronic device, comprising:

means for estimating a dependency of a bond strength degradation rate on at least one parameter;

means for estimating a temperature profile of the electronic device;

means for determining a bond strength based on the dependency of the bond strength degradation rate and the temperature profile; and means for determining the time to failure for the electronic device based on a time evolution of the bond strength.

* * * * *